United States Patent [19]

Ghosh et al.

[11] Patent Number: 5,642,324

[45] Date of Patent: Jun. 24, 1997

[54] BANKED SRAM DEVICE WITH BIT LINE REFRESH

[75] Inventors: Indraneel Ghosh, Rancho Cordova; Chin Shu Tan, Folsom; Wenteh Pan, Gold River; Subeer Kamal Patel, Santa Clara, all of Calif.

[73] Assignee: Intel Corporation, Santa Clara, Calif.

[21] Appl. No.: 580,862

[22] Filed: Dec. 29, 1995

[51] Int. Cl.$^6$ .................................................. G11C 7/00
[52] U.S. Cl. ........................... 365/230.03; 365/189.07; 365/203; 365/204; 365/236
[58] Field of Search .......................... 365/230.03, 203, 365/204, 236, 189.07, 222

[56] References Cited

U.S. PATENT DOCUMENTS

| | | | |
|---|---|---|---|
| 5,260,904 | 11/1993 | Miyawaki et al. | 365/204 |
| 5,274,597 | 12/1993 | Ohbayashi et al. | 365/230.03 |
| 5,299,167 | 3/1994 | Yano | 365/204 |
| 5,301,163 | 4/1994 | Reinschmidt et al. | 365/204 X |

*Primary Examiner*—Son T. Dinh
*Attorney, Agent, or Firm*—Blakely, Sokoloff, Taylor & Zafman

[57] ABSTRACT

A data storage device is provided. The data storage device, which is coupled to a data processing device, includes a memory array partitioning into a plurality of memory banks. The data storage device further includes a bank enable circuit for enabling at least one of the memory banks from the plurality of memory banks of the memory array. The data storage device also includes an operation/pseudooperation enable circuit (OPEC) for generating an operation or a pseudooperation signal to one or more banks enabled by the bank enable circuit. The OPEC has a first input for receiving an operation request signal from the data processing device and a second input. Additionally the data storage device includes a pseudooperation control circuit for controllably generating a pseudooperation request signal to the bank enable circuit and to the second input of the OPEC.

20 Claims, 11 Drawing Sheets

BANKED SRAM DEVICE WITH BIT LINE REFRESH

BACKGROUND OF THE INVENTION (1) Field of the Invention

The present invention relates to the field of static memories. More specifically, the present invention relates to an apparatus and method for discharging bit lines in a memory device.

(2) Description of the Related Art

Many microprocessors include set-associative level-1 (L1) cache devices to enhance performance. Often, L1 caches implement a "cache-banking" and "stop-clock" scheme to reduce power dissipation. The "stop-clock" mechanism involves halting the toggling of the clock signal, that is routed to various units of the microprocessor including the cache, if those units are not currently used. A set of elaborate conditions are used to detect when the clocks routed to a particular unit of the processor may be safely stopped without causing a malfunction—the details of those conditions are beyond the scope of this discussion.

To facilitate the understanding of the "cache-banking" scheme, which will be explained later in this section, the following discussion uses as a non-limiting example a cache device with the following characteristics: the address bus is 32 bits wide; the cache has 20 tag address bits (address bits 31:12); the cache has 8 set address bits (address bits 11:4); thus cache will have 256 sets; the cache has a line-size of 16 bytes (128 bits), the 4 lowest address bits [3:0] being used to specifically access any of the 16 bytes within a cache line; the cache can have any number of ways (depending on the cache size).

Figures 1A, 1B:
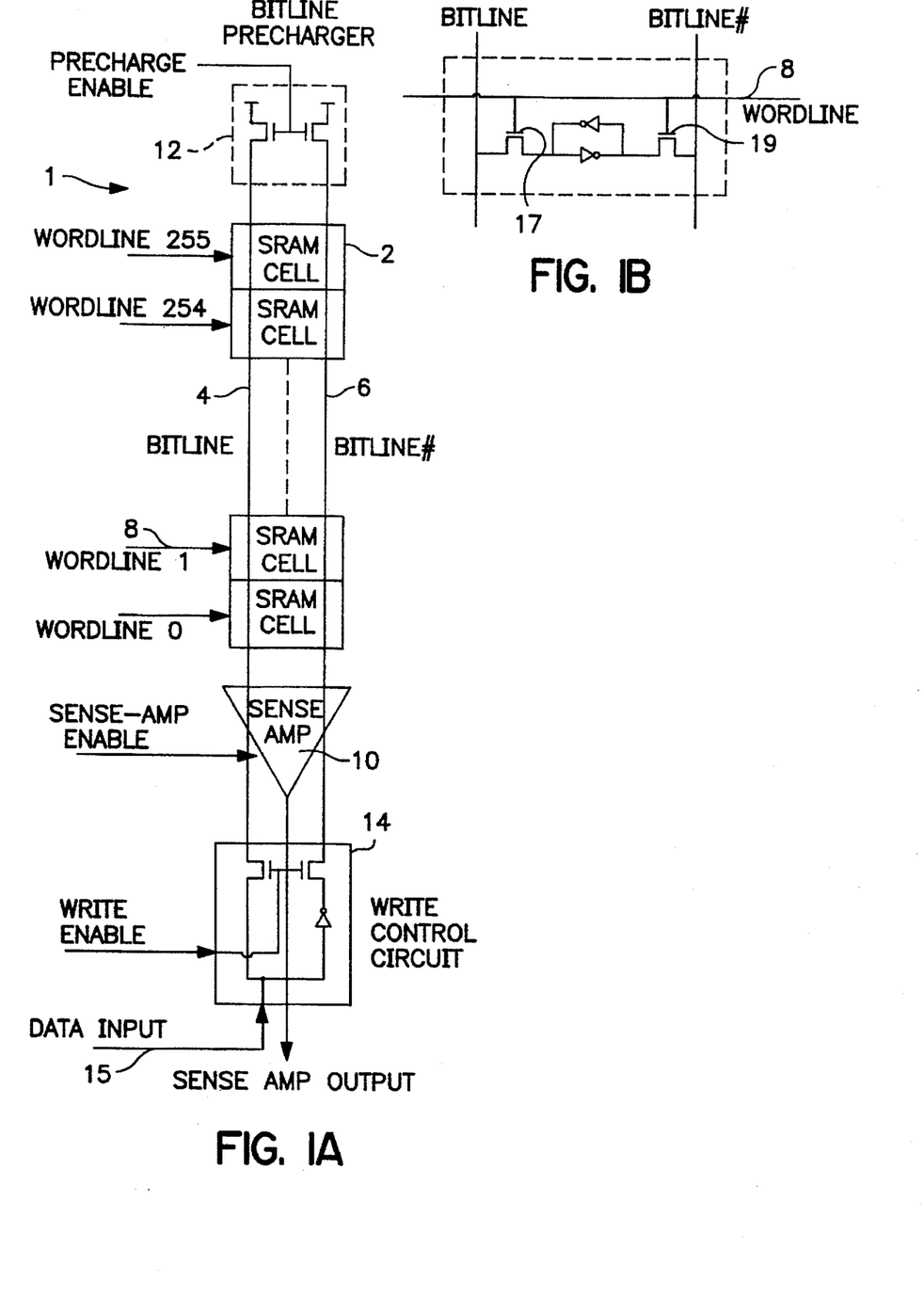
FIG. 1a shows a column of an SRAM cache array.
FIG. 1b shows a gate level representation of a typical SRAM cell.

FIG. 1a shows a column of an SRAM cache device. In this cache device, 256 SRAM cells 2 are placed on a same Bitline 4 and Bitline# 6, each SRAM cell having its own Wordline 8. The Bitline 4 and Bitline # 6 are gated as inputs to a sense amplifier 10 which detects differences in a level of voltage between Bitline and Bitline #. A pre-charge circuit 12 pre-charges the Bitline and Bitline # to the same level (VCC-$V_{tn}$), during a first half of every clock cycle. A write-control circuit 14 is used to drive the appropriate data values from a Drive Input line 15 along bitline and bitline # during a write cycle.

FIG. 1b shows a gate level representation of a typical SRAM cell. A pair of cross-coupled inverters will store a logic value and respectively, a logic complement of the logic value. The two NMOS transistors 17 and 19 serve as pass gates when a pulse is sent via the wordline 8. Data stored in the SRAM cell is thus read by driving bitline and bitline # with data stored in the SRAM cell.

Figure 2:
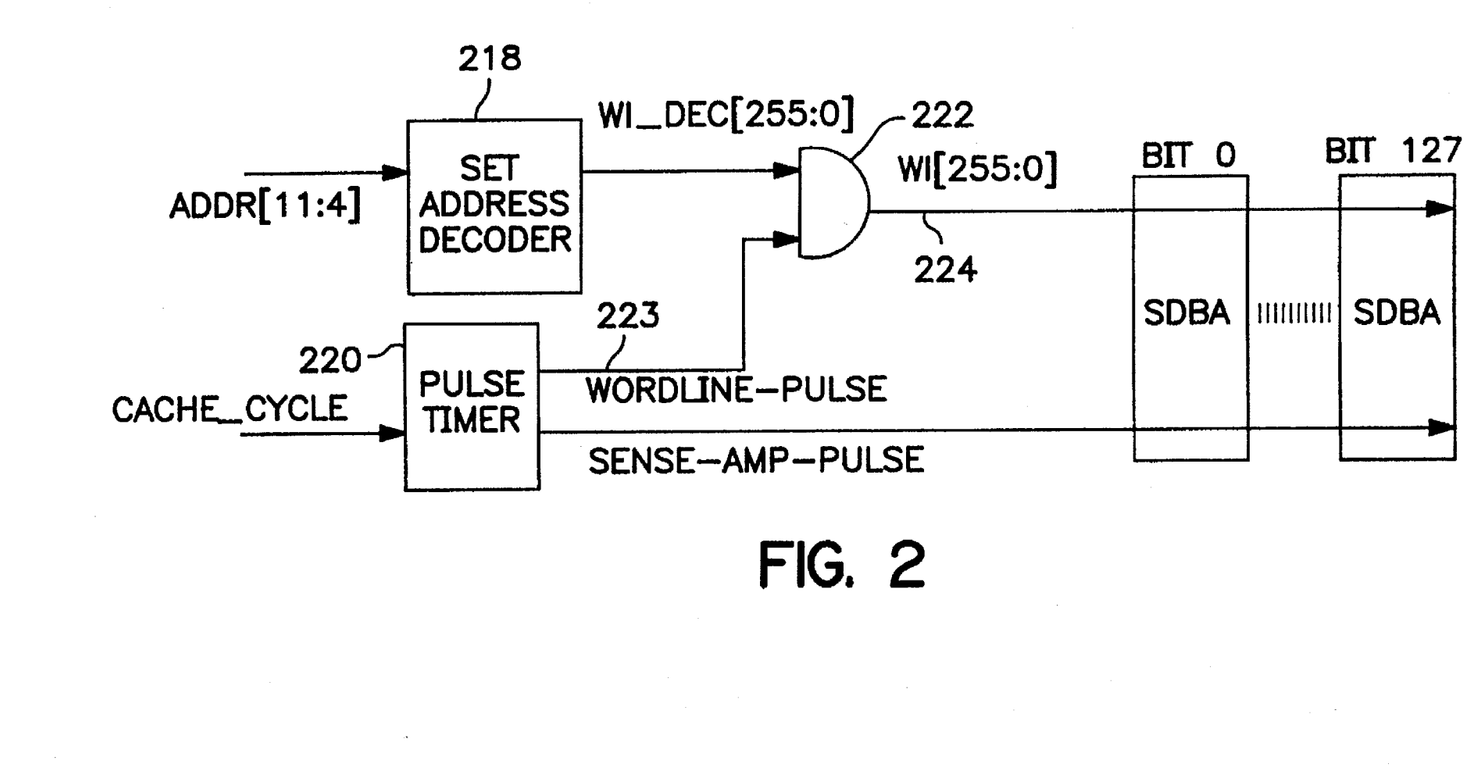
FIG. 2 shows a complete data array for an unbanked cache.

FIG. 2 shows the structure of a complete data array for an "unbanked" cache using Single Data Bit Array elements "SDBA" elements. An SDBA represents one column of the cache device. Since each cache line has 16 bytes (128 bits), 128 SDBA elements are shown in this figure. A set address decoder 218 decodes the Set address bits [11:4] outputting decoded wordlines WLDEC [255:0]. Only one of the 256 lines is active at any time. A Pulse Timer circuit 220 receives a CACHE_CYCLE signal from a processor (not shown). CACHE_CYCLE indicates that the cache is currently accessed by the processor. If the CACHE_CYCLE signal is active, the Pulse Timer generates, every clock cycle, a pulse of a certain length, after a certain delay, on each of the lines "wordline-pulse" and "sense-amp-pulse." The pulse on the "wordline_pulse" line causes an appropriate wordline decoded by the Set Address Decoder 218 to be pulsed.

An AND gate 222 is provided for each wordline of the cache. Each one of the 256 outputs of the Set Address Decoder is coupled to one input of a different gate 222. However, only one of these AND gates 222 will receive a $WL_{DEC}$ signal set to '1'. The "wordline pulse" line 223 coupled to Pulse Timer 220 is also input to each of the gates 222. Gate 222 generates at its output, which is connected to a wordline 224 of the cache array, a wordline signal WL which replicates the wordline pulse issued by the Pulse Timer if the corresponding wordline decode signal $WL_{DEC}$ is set to logic 1. In other words, if the address of a specific line has been decoded by the address decoder 218 and a CACHE CYCLE signal is issued by the processor, a selected line of the cache array will be pulsed. In so doing, an operation issued by the processor, such as a "read" or a "write", can be performed upon the cache array when additional signals required for these operations are provided by the pulse timer circuit 220 of FIG. 2. Upon reading or writing from or to a particular SRAM cell, the respective bitline and bitline # coupled to the SRAM accessed by the microprocessor will be discharged. Typically, the bitlines of a static memory, such as the memory shown in FIGS. 1 and 2, act as capacitors and are precharged to a predetermined voltage prior to reading the SRAM cells. The state assumed by the SRAM memory cell is read by applying an input voltage to the selected wordline and sensing which bitline experiences a change in voltage. The state assumed by a selected SRAM memory cell determines which bitline, Bitline or Bitline #, will be discharged towards ground or VSS when the cell is read. A write operation is performed in a similar way by discharging a specific bit line.

Accesses to the cache device are sequenced by a clock generating clock cycles. Each clock cycle can be conceptually divided into two equal phases. The first phase, first half of the clock-cycle, is the precharge phase, wherein the precharge circuitry 12 of FIG. 1 precharges the bitline and bitline# to the same high voltage level (VCC-$V_{tn}$) where $V_{tn}$ is the threshold voltage for the NMOS device used to precharge the two bitlines. The precharger is turned off in the second phase, when one of three following events will occur. One possibility is that no bit is accessed during that clock cycle, the bitline and bitline# remaining precharged at their high levels. The bitlines will not be discharged and, thus, no power will be dissipated. None of the wordlines nor the sense-amp-enable will be activated if no cache access occurs during the second phase. Another possibility is that a particular SRAM cell is written to. In this case the "Write Control Circuit" 14 of FIG. 1a will drive a "1" on bitline and a "0" on bitline# or vice-versa, depending on the value that is written into the SRAM cell. The appropriate wordline, for the correct set, will be pulsed and the correct value will be written in the SRAM cell for that particular set. The sense-amp-enable signal does not need to be activated for a write cycle. Yet, another possibility is that a particular SRAM cell is read from. The appropriate wordline including that SRAM cell will be pulsed, causing that SRAM cell to drive the bitline and bitline#, using the data stored therein. The sense-amp enable line will be pulsed and the sense-amplifier will sense the voltage difference between bitline and bitline# driving thus the correct logic level at the sense-amp output.

In all the cases mentioned above, whenever a high value is driven on bitline and bitline#, that high-value is always driven through NMOS devices via one of the following: the bitline precharger, the SRAM cell itself, or the write control circuit. Accordingly, the high level on either the bitline and bitline# should not exceed (VCC-$V_{tn}$). Henceforth, whenever the term "voltage" is mentioned in the context of the sense-amplifier gain, reference will be made to the "inactive" high-voltage level at which bitline and bitline# are found, when there is no cache access and thus no discharge of the bitlines. This voltage level, theoretically, has to be the same as the precharge-level. As it will be further explained, this is not always the case.

Figure 3:
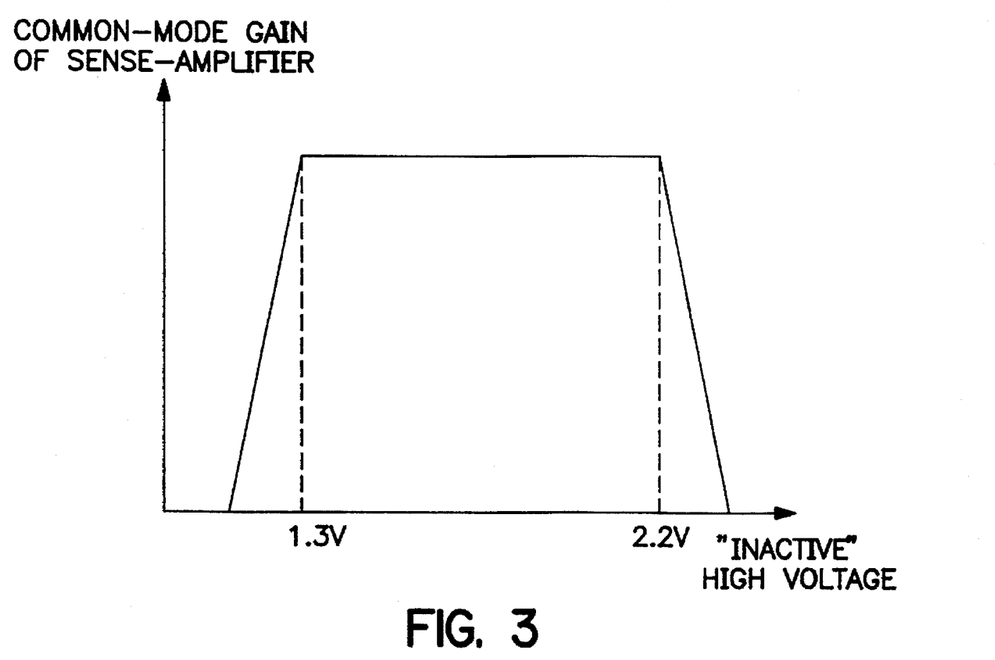
FIG. 3 shows a plot of a sense amplifier gain versus voltage.

As it is apparent from FIG. 3, which illustrates by way of non-limiting example, a plot of a sense amplifier gain versus the above-mentioned "inactive" high voltage, the sense-amplifier has a high-gain region between 1.3 V and 2.2 V. Outside this region, the gain drops off very dramatically. In the particular case, the VCC was at 2.7 V and the (VCC-$V_m$) level was within the high-gain region 1.3 V 2.2 V.

In an "unbanked" cache design, all 128 SDBAs will share the same wordlines [255:0] and the same sense-amp enable lines shown in FIG. 1. Since the sense-amp enable of all 128 SDBAs are connected together, the sense-amplifiers in all SDBAs would be turned on as soon as a CACHE CYCLE signal is executed. Therefore, during any cache read-operation wherein a pulse would be sent through one of the wordlines, all the bitlines (and bitlines #) of all 128 SDBAs would be discharged, thereby causing power to be dissipated in all the bitlines of the cache device.

Figure 4A:
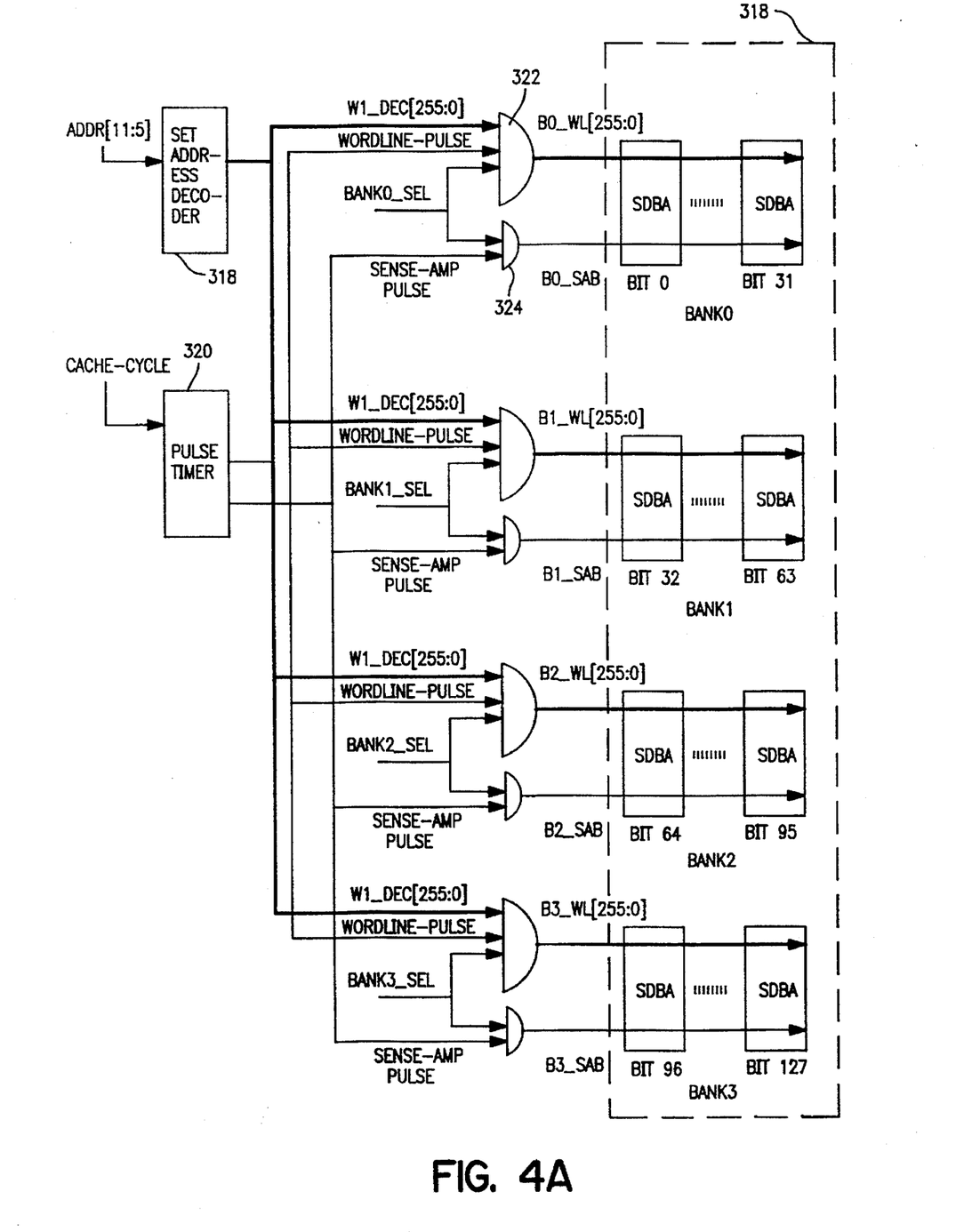
FIG. 4a shows a banked cache.

Part of the power dissipated in an "unbanked" cache, when a read/write operation is issued by the processor, can be saved by using a "cache-banking" scheme. FIG. 4a illustrates a banked cache. The "cache-banking" scheme is premised on the fact that in most cache accesses, the micro-processor data-path (computational logic) does not use all the information that is present in a cache line at one time. For example, according to cache-banking scheme shown in FIG. 3, the 16-byte cache-line can be divided into smaller "chunks", each of which can be accessed as an atomic unit. A cache line 308 can be divided into four 4-byte chunks or into eight 2-byte chunks and so on. The granularity of this division depends on factors like the data path width of the microprocessor and on how much power needs to be saved.

Each cache line (16 bytes) in FIG. 4a is thus divided into four 4-byte (32 bit) chunks. Each such chunk will be called hereinafter a "bank." Banks are accessed as follows:

Access Bank 0→(bytes 0,1,2,3 of cache line)→bits [31:0]

Access Bank 1→(bytes 4,5,6,7 of cache line)→bits [63:32]

Access Bank 2→(bytes 8,9,10,11 of cache line)→bits [95:64]

Access Bank 3→(bytes 12,13,14,15 of cache line)→[127:96]

The starting address and the length (amount of data to be read/written) of a cache cycle, will determine which of the cache banks should be accessed during a cycle. In all cache accesses, all 4 bytes in each bank are accessed as a group. More than one bank 1 however, can be accessed simultaneously. For example, if the starting address of an 8-byte read access is at byte 4, Bank 1 and Bank 2 need to be accessed. In a banked cache when a microprocessor's control unit sends out the starting address and the length (in bytes) for each cache access, this information is used to intelligently turn on only those banks that are needed for that cycle. Since all the tag and (least recently used) LRU/valid bits for any cache line need to be accessed for any cache cycle, the tag and LRU/valid arrays will not be banked.

As one can see from FIG. 4a, the data array 308 is divided into four banks as explained above. Each bank of the data array 308 has 256 AND gates 322. Each of these gates 322 receive the following inputs: a line $WL_{DEC}$ from decoder 318, which corresponds to the respective wordline of the data cache array to which gate 322 is coupled at an output thereof; a wordline pulse coupled to pulse timer 320 for coupling a wordline pulse signal to the gate 322; and a bank select Bank$_{sel}$ line coupled to a bank select circuit (not shown) for enabling one or more selected banks of the cache data array 308. When a particular bank is selected, then only the appropriate wordline of that particular bank will be pulsed upon the generation of a wordline pulse signal by the pulse timer 320. As one can see, the other remaining three banks will have their Bank$_{sel}$ signal set to 0 logic and, thus, the output of gate 322 coupled to the respective un-selected banks will be 0. According to this scheme, even in the instances where the CACHE CYCLE signal, input to the pulse timer 320, is issued by the processor to initiate a cache access to data array 308, the wordlines of non-selected banks of memory will not be pulsed. Thus, in these banks power will not be dissipated upon the access of one of the SRAM cells of a selected bank.

As one can see from FIG. 4a, an AND gate 324 has an output coupled to the sense amplifiers of each bank. Each Bank$_{sel}$ signal is coupled to the gate 324 corresponding to the respective bank. Therefore, the sense amplifier corresponding to each bank will only be turned on if both a "Sense Amp Pulse" signal is issued and a bank select signal Bank$_{sel}$ is issued.

For example, for accesses which only require Bank 1 and Bank 2 to be turned on, the bitlines in Bank 0 and Bank 3 will not be discharged and similarly the respective sense amplifiers corresponding to Bank 0 and Bank 3 will not be turned on. In this example, the banked-cache scheme can save about half the power that otherwise would be dissipated in an "unbanked" cache data array. If access is needed to only one bank during a certain cycle, the power saved can be even greater. The power saving can increase as the granularity of banking in the cache line is increased, e.g. a cache with eight 2-byte banks would end up saving more power for certain cycles. Another related benefit of using cache-banking is that this scheme reduces the relative frequency of power surges on the chip since not all banks need to be discharged for every cache cycle. This helps mitigating electron-migration problems in silicon. Power surges (high power dissipation) causes high current densities in the metal lines that route VCC, VSS, and other signals throughout the chip. If the incidence of such high current densities become very frequent, it causes those metal lines to become thinner due to migration of electrons ("electron migration"). The lines may ultimately break, causing functional failure. While the cache banking scheme can significantly reduce the power dissipated in a cache memory, static memories suffer from a problem inherent in the structure of these memories. This problem is called "voltage creep" and will be explained in conjunction with the following discussion.

Figure 4B:
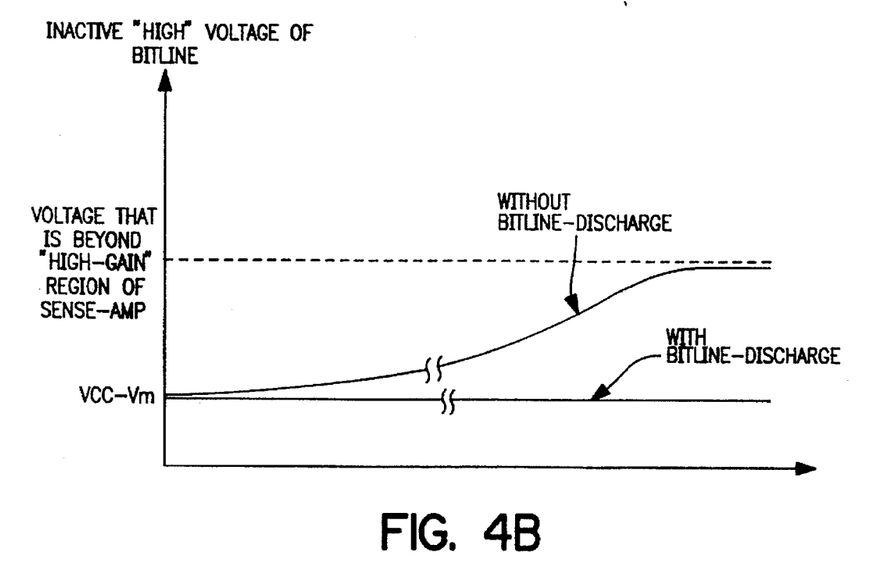
FIG. 4b shows a plot of a bitline's voltage with "voltage-creep"

The "bitline creep" is a behavior of a cache device which can be encountered when the voltage on the bitline and bitline# starts "creeping up" above (VCC-$V_m$), due to leakage through the transistors in the precharge circuit and write-enable circuit. For each individual clock cycle, the amount of leakage, or the creep in voltage is minuscule. However, if this leakage is allowed to occur over many hundreds clock cycles, the cumulative creep in bitline and bitline# voltages will take these lines out of the "high-gain" region for the sense-amplifier as shown in FIG. 4b. If this occurs, then on the next read-access to the cache, the sharply reduced gain of the sense-amp will cause a much longer delay in generating the sense-amp output. Thus, the sense-amp will output meaningless data for a longer duration before it will be able to successfully detect the differential between bitline and bitline#, and thus send out the correct output data. This delay in sense-amp output generation, will cause many problems such as incorrect hit/miss detection in the tag-comparison logic and setup-time violations in the logic that uses the cache data output.

However, any read/write access operation to the data memory array before its bitline inactive-voltage "creeps" out of the "high-gain" region of the sense-amp can cause the bitline and bitline# to descend to the normal "VCC-$V_{tn}$" level, thereby discharging bitline and bitline#. As mentioned before, for a read access, the SRAM cell will actively drive a high value of (VCC-$V_{tn}$) on one of the lines, through the corresponding NMOS transistor in the SRAM cell. For a write access, the write-control-logic will actively drive a high value of (VCC-$V_{tn}$) on one of the lines, through the corresponding NMOS transistor in the Write Control Circuit. Accordingly, the voltage "creep" problem occurs only if there is a sufficiently long and continuous series of inactive cycles which will allow the bitline and bitline# voltage to creep beyond the high-gain region of the sense-amp.

FIG. 4b shows a graph of bitline-voltage vs. time during a long period of inactivity. This graph illustrates the "voltage creep" in an SRAM device that does not use a "bitline-discharge" mechanism. FIG. 4b also shows how this "voltage creep" problem is alleviated by using a bitline discharge mechanism.

Figure 5:
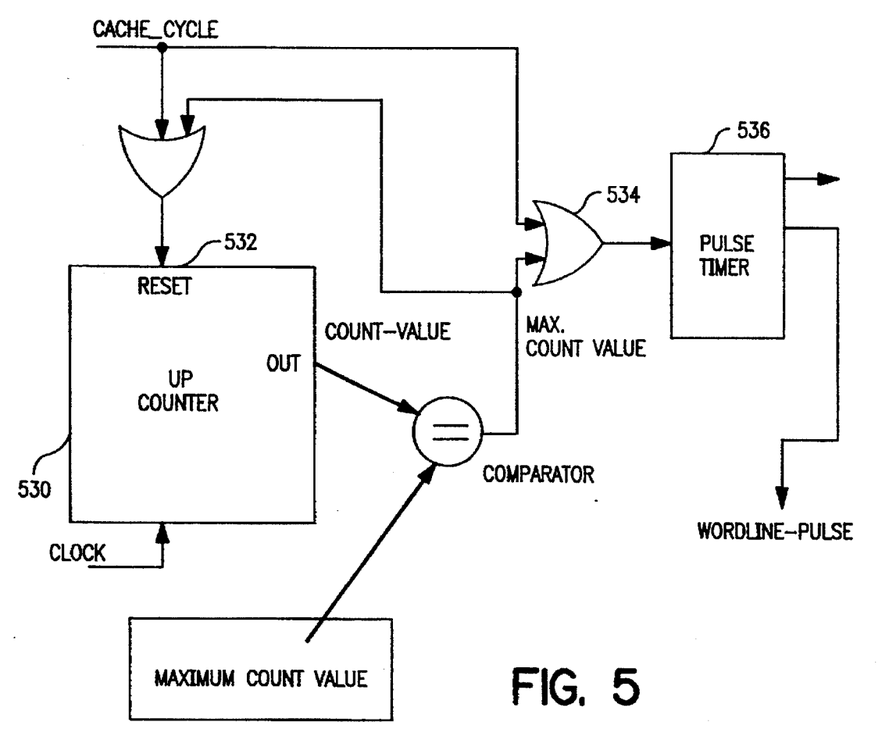
FIG. 5 shows a prior art bitline discharge circuit for an unbanked cache.

Such mechanism is disclosed in the patent application of Chang, et al. 08/437,090 issued to Intel Corporation of Santa Clara, Calif., which discloses a memory with a bitline discharge mechanism for unbanked caches which do not have a "stop-clock" mechanism. FIG. 5 illustrates some of the salient features of Chang. The circuit illustrated in this figure is used for generating a wordline pulse to an un-banked cache memory (not shown) to avoid the bit line creep problem. The counter 530 is a simple digital up-counter, with a reset gate for receiving a reset signal. Whenever the Reset signal is asserted, the counter starts counting from 0 up to the "Maximum Count Value." As this figure shows, the counter will be automatically reset once the maximum count value is reached. When the counter reaches the Maximum Count Value, an additional bitline discharge is triggered by having the pulse timer 536 issue a wordline-pulse signal. This additional bitline discharge hereinafter will be denominated as a pseudooperation. If a "RESET" signal, due to assertion of "Cache_Cycle", is received before the counter reaches the "Maximum Count Value," the counter will be reset starting to count from 0. This counter-driven discharging mechanism for the bitlines causes additional power dissipation. Furthermore, since all bitlines (i.e. the full cache line in the data array) are discharged at the same time, it causes relatively frequent "power surges." This could result in serious electron migration problems in silicon.

Banked cache memories may additionally use a "stop-clock" mechanism for saving power. In this case, even though the cache may be accessed during a particular cycle, not all the banks and, thus, bitlines in the data array may necessarily be discharged if a bitline discharge mechanism such as the one illustrated in FIG. 5 was used. To understand this problem, let us assume that during 100 clock cycles, Bank1, Bank2, and Bank3 of the banked cache device shown in FIG. 3 are frequently accessed, but Bank0 is not accessed at all during this time. In this case, there will be at least one cache access for every 100 clocks and, thus, the counter of FIG. 5 will be reset each time such that the counter will not reach a count of 100 (Maximum Count Value). We will assume that the bitlines will "creep up" beyond the "high-gain" region of the sense-amplifier, during 100 clocks of inactivity required for triggering a bit line discharge within those clocks, because the counter was reset for every cache access to any bank. This would prevent any pseudooperation bitline discharge from occurring in Bank0, causing the bitlines of Bank 0 to remain inactive for 100 clocks. Accordingly, because Bank 0 was not accessed during 100 consecutive clock cycles, the voltage of bitlines in Bank 0 will creep up beyond the "high-gain" region of the sense-amp. Thus, the next read access to Bank0 may encounter a large delay while the sense-amplifier tries to detect the differential between bitline and bitline#. A speed failure would occur if the Chang reference was used in conjunction with a banked cache.

Moreover, the "stop-clock" feature described above complicates the problem even more. Whenever the clock is stopped, the counter in FIG. 5, which runs on the clock, stops counting. Accordingly, if the counter has been stopped due to a stop-clock signal for a time longer than 100 clocks, enough time would elapse to cause the bitlines to creep up to a voltage which is beyond the "high-gain" region of the sense amplifier. It is, thus, possible that an actual cache read access would be issued to the cache memory before the counter reaches its Maximum Count Value and is able to trigger an additional bit line discharge. In this case, the sense amplifier may cause a substantial delay, thereby causing a failure in the operation of the cache memory.

Accordingly, it is desirable to provide for a banked data storage device with a mechanism for providing bitline discharges such that the creep up problem is avoided. Additionally, it is desirable to provide for a bank data storage device having a stop clock feature for saving power such that the voltage on the bitlines will not creep up in cases where the clock is stopped for a period of time longer than the time that generally takes to the bitline to creep up.

BRIEF SUMMARY OF THE INVENTION

The present invention provides for a data storage device having a pseudooperation control circuit for controllably generating a pseudooperation signal to a Bank enable circuit and to an input of an operation, pseudooperation enable circuit. The operation, pseudooperation enable circuit generates an operation or a pseudooperation signal to one or more banks of a memory array.

More specifically the present invention provides for a data storage device coupled to a data processing device. The data storage device includes: a memory array partitioned into a plurality of memory banks; a bank enable circuit, for enabling one or more memory banks from the plurality of memory banks; an operation/pseudooperation enable circuit (OPEC) for generating an operation signal or a pseudooperation signal to one or more banks enabled by the bank enable circuit, the OPEC having a first input for receiving an operation request signal from the data processing device, and a second input; and a pseudooperation control circuit for controllably generating a pseudooperation request signal to the bank enable circuit and to the second input of the OPEC.

The present invention also provides a computer system having a memory array partitioned into a plurality of memory banks, a data processing device, and a bus, coupled to the data processing device, for coupling to the memory array. The computer system according to the present invention includes a bank enable circuit coupled to the bus for enabling one or more memory banks from the plurality of memory banks. The computer system further includes an operation/pseudooperation enable circuit coupled to the bus, for generating an operation signal or a pseudooperation signal to one or more banks enabled by the bank enable circuit. The operation/pseudooperation enable circuit has a first input for receiving an operation request signal from a data processing device and a second input. The computer system according to the present invention further includes a pseudooperation control circuit for controllably generating a pseudooperation request signal to the bank enable circuit and to the second input of the operation/pseudooperation enable circuit.

BRIEF DESCRIPTION OF THE DRAWINGS

The features, aspects, and advantages of the present invention will become more fully apparent from the following detailed description, appended claims, and accompanying drawings in which:

DETAILED DESCRIPTION OF THE INVENTION

In the following description, numerous specific details are set forth to provide a thorough understanding of the present invention. However, one having an ordinary skill in the art may be able to practice the invention without these specific details. In some instances, well-known circuits, structures, and techniques have not been shown in detail to not unnecessarily obscure the present invention.

Figure 6:
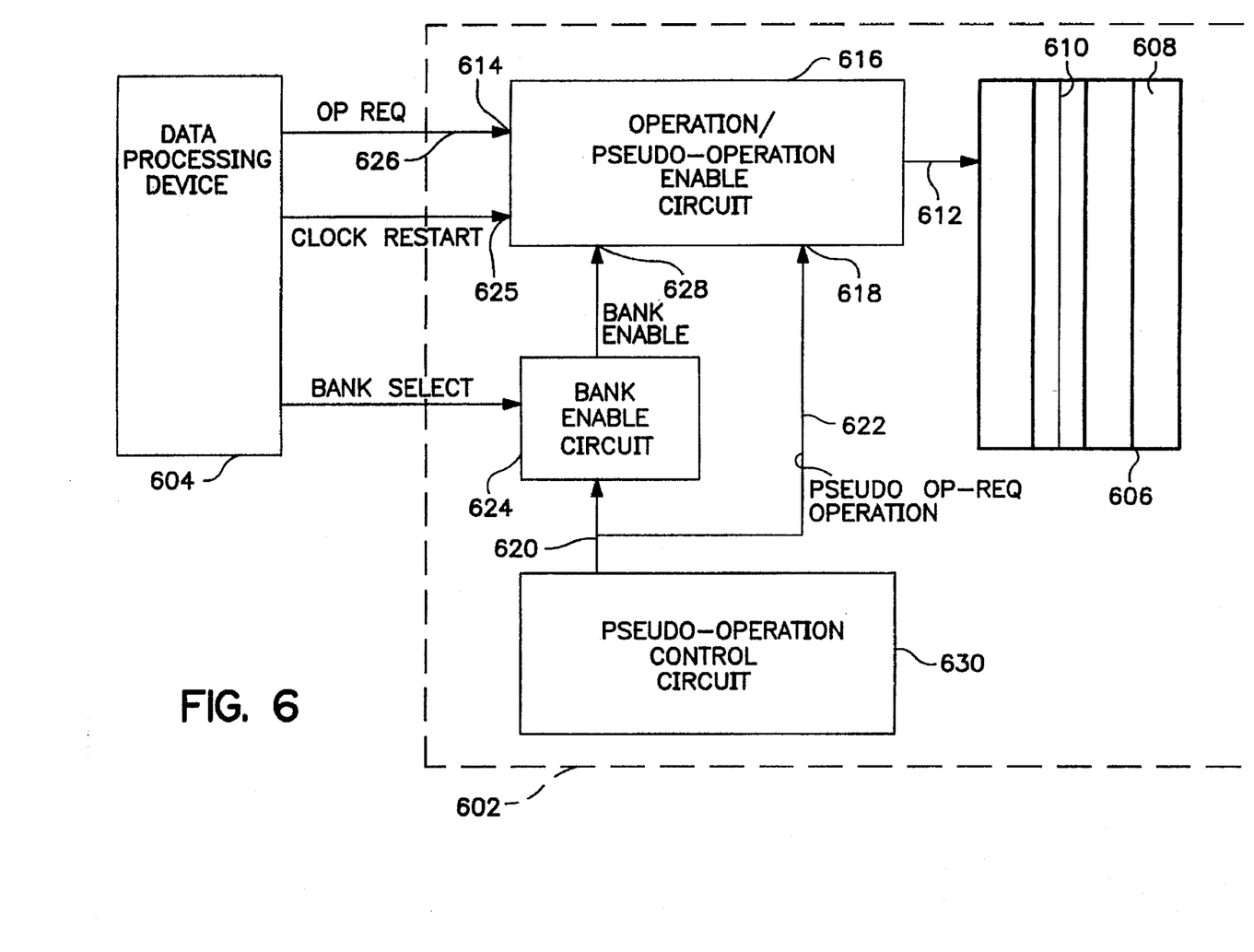
FIG. 6 is a block diagram of the data storage device according to the present invention.

FIG. 6 illustrates a data storage device (shown in dotted lines) according with the present invention 602. The data storage device 602 is coupled to a data processing device 604 which can be by way of non-limiting example a microprocessor. The data storage device 602 according to the present invention includes a memory array 606, which can be an SRAM cache device, by way of non-limiting example. Memory array 606 is partitioned into a plurality of memory banks 608. Each memory bank 608 includes a plurality of bit lines 610. The embodiment illustrated in this figure includes four banks of memory. The number of banks of memory, however, can vary according to the desired implementation.

The data storage device according to the present invention further includes a bank enable circuit 624 for enabling one or more memory banks from the memory array 606. Additionally, the data storage device according to the present invention includes an operation/pseudooperation enable circuit (OPEC) 616. The OPEC generates an operation or a pseudooperation signal via line 612 to a bank enabled by the bank enable circuit 624. OPEC 616 has a first input 614 for receiving an operation request signal from the data processing device 604 via line 626, a second input 628, for receiving a bank enable signal from the bank enable circuit 624, and a third input 618 coupled to a pseudooperation control circuit 630 via line 622. The pseudooperation control circuit further has a fourth input 625, connected to the "clock-restart" signal, generated by the data processing device 604 in FIG. 6. The pseudooperation control circuit 630 controllably generates a pseudooperation request signal via line 620 to the bank enable circuit 624. The pseudooperation request signal is also fed to a third input 618 of the OPEC via line 622.

Generally, in the present application, an operation is defined as a read or write operation, initiated by the data processing device 604, from or to the memory array 606. A pseudooperation is defined as a bit line discharge initiated by the pseudooperation control circuit 630. Operations are typically initiated by the data processing device 604 which asserts an Operation Request signal at gate 614 of the OPEC. Pseudooperations are initiated by the data processing device which asserts a Clock Restart signal at gate 625, or by pseudooperation control circuit 620 which asserts a pseudooperation request signal input at gate 618. The OPEC will send, in response, a pulse via line 612, to a selected wordline and a selected bank of the memory array 606. This pulse has the effect of discharging the bitlines of the selected bank from a first voltage potential to a second voltage potential. Typically, the first voltage potential is a "creep-up voltage," while the second voltage potential, to which the bitlines of the selected bank are discharged, is $V_{CC}$-$V_{TN}$.

Figure 7:
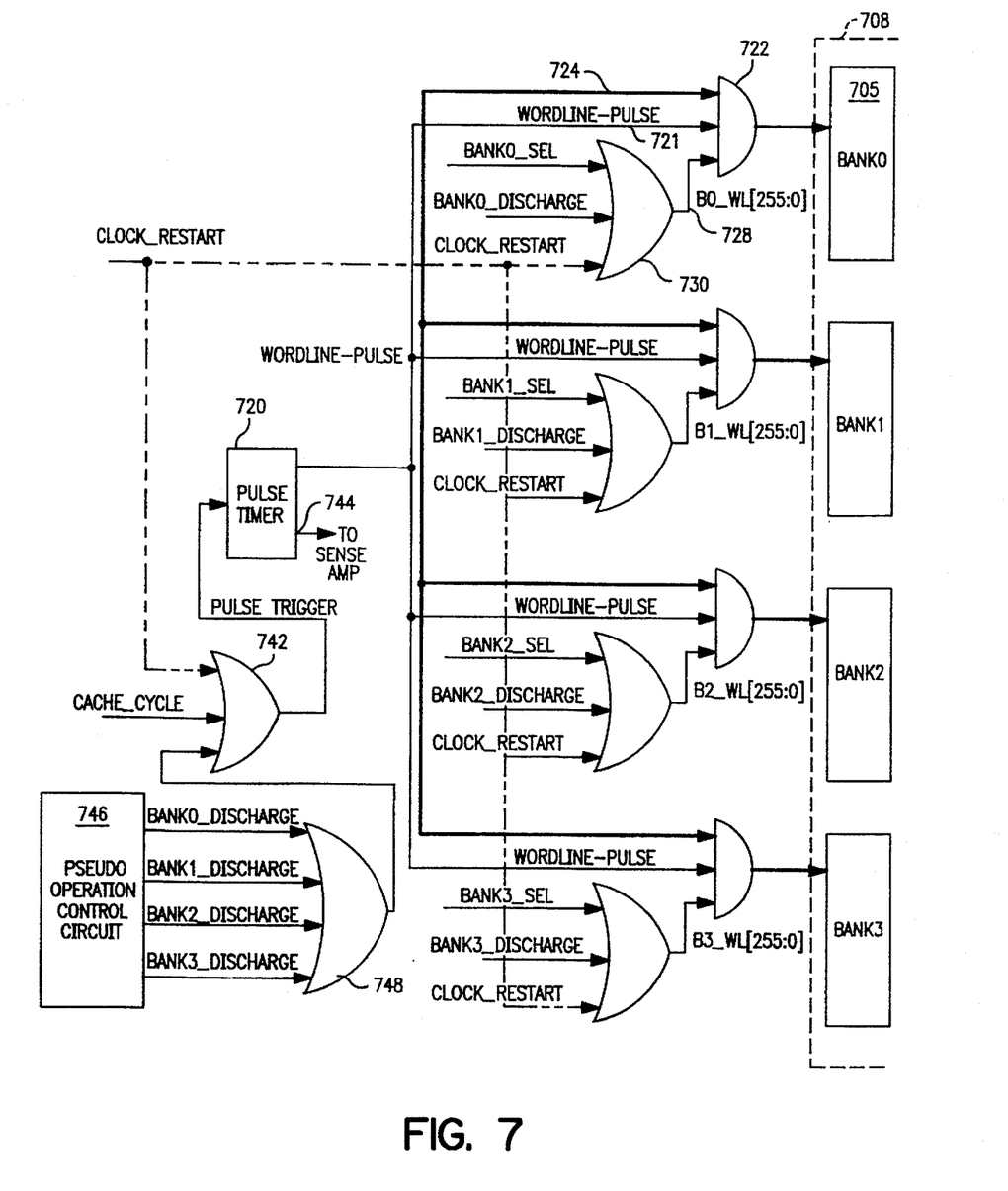
FIG. 7 is a more detailed illustration of the data storage device according to the present invention.

FIG. 7 is a more detailed illustration of the data storage device according to the present invention. In this particular embodiment, the memory array 708 (shown in dotted lines) is partitioned into four banks, Bank0, Bank1, Bank2 and Bank3. The following explanations are provided with reference to Bank0, but they equally apply to Bank1, Bank2 and Bank3 as the circuitry coupled to Bank1, Bank2 and Bank3 is substantially identical with the circuitry coupled to Bank0. Bank0 709 includes one or more bit lines (not shown) which can arrive at the bit line creep condition when a respective bit line has not been discharged for a period of time exceeding a bit line creep time. The "bit line creep time" can be defined as the time that it takes to each bit line to charge up from a first voltage potential, which can be $V_{CC}$-$V_{TN}$, to second voltage potential. The second voltage potential is typically a voltage potential higher than $V_{CC}$-$V_{TN}$, which causes significant bit delay at the output of the sense amplifier when an SRAM cell coupled to that respective bitline is read. The memory array 708 can be, by way of non-limiting example, an SRAM cache device having the bit line structure and the interconnections substantially similar to the bit line structure and interconnections shown in FIG. 1.

In this particular embodiment, the operation/pseudooperation enable circuit (OPEC) includes AND gate 722. The operation/pseudooperation enable circuit is not, however, limited to an AND gate. Rather the AND gate 722 is an illustrative example of the operation/pseudooperation enable circuit and not a restrictive example. While FIG. 7 shows one AND gate 722 per bank of memory array, generally, there are as many AND gates 722 as there are word lines in each bank 709 of the memory array 708. Accordingly, the following description applies to each of the 256 word lines of the memory array of the preferred embodiment illustrated in FIG. 7.

Gate 722 has a first input for receiving a word line select signal via line 724. As explained above, the word line select signal received via line 724 corresponds to a memory location having a specific address issued by a data processing device, i.e. a microprocessor (not shown in this Figure) when access to the respective address is desired. Accordingly, the word line select signal on line 724 will be set to a logic 1 when an operation, such as a read or a write, is requested by the processor with respect to an SRAM cell residing at an address corresponding to line 724. Gate 722 has a second input for receiving a word line pulse via word line pulse line 726. The word line pulse signal received via line 726 can be generated, by way of example, by a pulse timer 720. The operation of the pulse timer will be explained in more detail later in this section. Finally, the gate 722 includes a third input for receiving a bank enable signal from an OR gate 730 via the line 728.

The OR gate 730 represents a bank enable circuit in the preferred embodiment shown in FIG. 7. According to this bank enable circuit, when any of the inputs to the OR gate 730 such as Bank0 Select, Bank0 Discharge or Clock Restart are set at logic 1 the Bank0 of the memory array 708 will be enabled. For example, depending on the first and second inputs to gate 722, a word line in Bank0 can be pulsed when the word line pulse signal output by the pulse timer 720 is triggered.

The operation/pseudooperation enable circuit (OPEC) further comprises pulse timer 720 and OR gate 742. The pulse timer 720 has an input for receiving a pulse trigger signal from an output of OR gate 742. The pulse timer 720 has an output for generating the word line pulse signal in response to the pulse trigger signal 744. The pulse timer 720 consists of self-timing circuitry which uses "model arrays" to model the actual SRAM loading. This enables the timer to adjust itself automatically, to variations in the semiconductor manufacturing process to control the pulse widths and timings of pulses. This type of circuitry is well know in the art. The pulse timer 720 has a second output 744 for generating a second pulse signal to sense enable input of a sense amplifier such as the one shown in FIG. 3. For a banked cache, this pulse signal is typically coupled to AND gate 324 (for Bank0) shown in FIG. 3 (and so on for the other banks).

OR gate 742 generates a signal to the pulse timer which will trigger the issuance of the word line pulse to gate 722. As one can see gate 742 has three inputs for receiving, a clock restart signal, a cache cycle signal, and a pseudooperation request signal generated by a pseudooperation control circuit 746. Accordingly any one of these signals can trigger the generation of word line pulse on line 726 to the AND gate 722 of the operation/pseudooperation enable circuit. The Clock Restart Signal can be used to trigger an additional bit line discharge on the bit line of a selected bank memory whenever the clock is restarted. The clock is typically restarted after having been stopped for some time by a power management scheme. The Clock Restart signal is input to both gate 742, for generating word line pulse when the clock is restarted, and to each bank enable circuit of the memory array 708. In such way, it is ensured that with every clock restart all the bank memories will be discharged.

An operation request signal, such as the Cache Cycle signal, is input to the OR gate 742 of the operation/pseudooperation enable circuit. The Cache Cycle signal, as explained above, is issued by the data processing device every time an operation such as read or write is desired. The data storage device according to the present invention, provides for a mechanism which ensures that a first cache access, after the clocks have been shut off and subsequently restarted, will be issued when the cache device is fully operational. The cache cycle signal will thus be input to gate 742 at least two clock cycles after the clocks are restarted, i.e., at least two clock cycles after the clock restart signal becomes active. Accordingly, the logic generating the clock restart signal can be designed to assert this signal at least two clock period before the clocks actually start toggling.

The data storage device according to the present invention, also provides for discharging the bitlines of a selected bank or banks of the memory array 708 when that bank/banks has not been accessed for a long time. The pseudooperation control circuit of the present invention 746 controllably generates a pseudooperation request signal which can be Bank0 discharge, Bank1 discharge, Bank2 discharge and Bank3 discharge depending on the selected bank. The operation of the pseudooperation control circuit 746 will be later discussed in this section. As one can see from FIG. 7, OR gate 748 has four inputs coupled to the pseudooperation control circuit 746 for receiving the four signals which indicate a pseudooperation request by said pseudooperation control signal. As explained above, the number of banks into which the memory array 708 is partitioned is arbitrary. A person having ordinary skills in the art can have the memory array 708 partitioned into a larger or smaller number of memory banks depending on the power saving objectives. Accordingly, the OR gate 748 could have more or less bank discharge signals coupled its input. When any of the pseudooperation request signals is asserted, the output of gate 748 will be set at logic level 1. Accordingly, the output of gate 742 will be equally set to logic level 1. The pulse timer 720 will thus generate a word line pulse to line pulse 726 when one or more pseudooperation request signals is generated by the pseudooperation control circuits 746. Accordingly, one or more banks will receive a pulse on one of the 256 word lines. this pulse will cause one or more of the memory banks to be discharged thereby avoiding the voltage creep problem.

Figure 8:
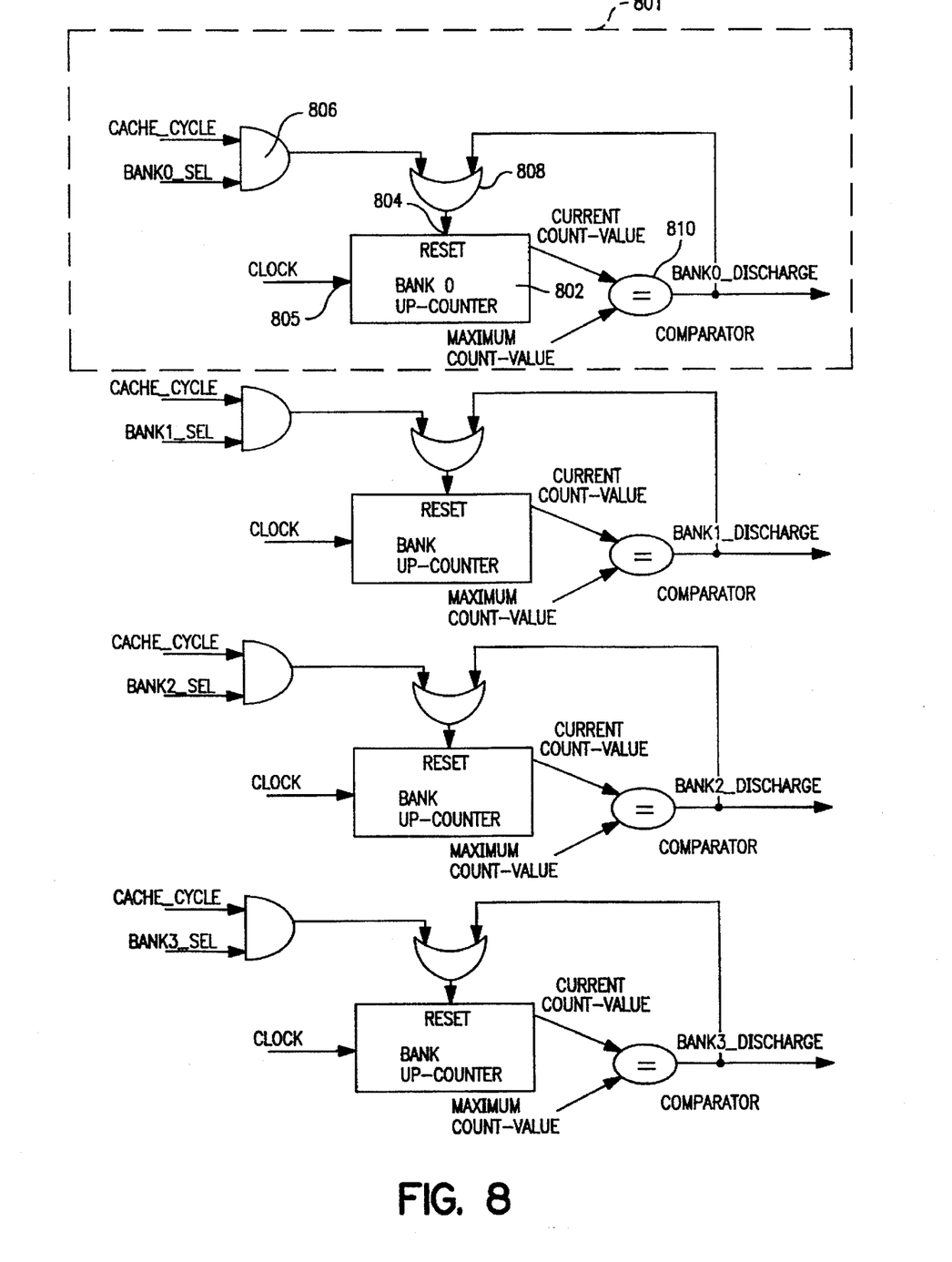
FIG. 8 illustrates a pseudooperation control circuit of the data storage device according of the present invention.

FIG. 8 illustrates the structure of the pseudooperation control circuit 746 of FIG. 7. As one can see in this figure, there are four circuits 801 corresponding to each of the memory banks of the memory array 709 of the data storage device according to the present invention. The following discussion will be made with reference to only one of the circuits shown in this figure, as these circuits are identical in structure and functionality. Circuit 801 includes a counter 802 with a reset gate 804. When a reset signal is received at gate 804, the counter is reset starting to count up from zero. The counter 802 has a gate 805 for receiving a clock signal having a clock period substantially equal with a clock period of the data processing device and of the data storage device according to the present invention. The pseudooperation control circuit according to the present invention further includes the AND gate 806 having a first input receiving the Cache Cycle signal and a second input receiving a Bank0 select signal. This gate detects whether a particular bank, in this example Bank0, was accessed in a particular clock cycle. If Bank0 was accessed in a particular clock cycle, the output of gate 806 will generate a signal having a high logic level value which will reset the counter, as the output of gate 806 is coupled to one of the inputs of OR gate 808. Gate 808 has an output coupled to the reset gate 804 of the counter 802. When the counter's current count value (not shown) in FIG. 8 reaches the maximum count value, a pseudooperation, i.e., a bit line discharge, is triggered to Bank0 by the Bank0 discharge signal generated by a comparator 810. When the counter reaches its maximum value, the comparator 810 issues the Bank0 discharge signal, which is fed back to the reset gate of the counter via the OR gate 808. In this way it is ensured that if no Cache Cycle occurs, during a time interval required for the counter to reach the maximum count value, the bit lines for a bank will be discharged in time to avoid the creep up problem. For the tag and LRU arrays, a similar counter can be used except for the fact that the cache cycle signal itself will drive the reset gate of the counter as opposed to having the AND gate 806 coupled to the Bank enable signal.

Figure 9:
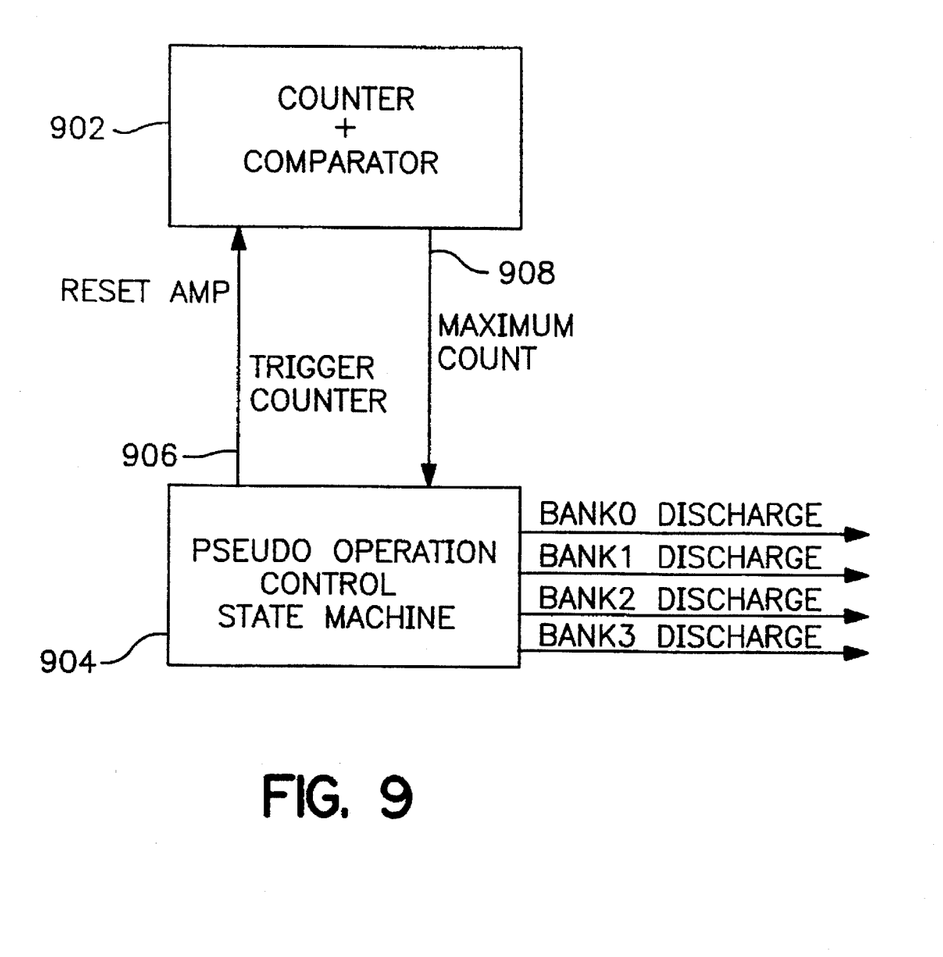
FIG. 9 shows an alternative embodiment of the pseudooperation control circuit of the data storage device according to the present invention.

FIG. 9 shows an alternative embodiment of the pseudooperation control circuit according to the present invention. As one can see, this embodiment incudes a counter and a comparator circuit 902 which works similarly to the counter and comparator of the preferred embodiment shown in FIG. 8. The counter and comparator 902 are coupled to a pseudooperation control state machine via the "Reset and Trigger Counter" line 906 and via the "Maximum Count" line 908. When a maximum count signal, issued by the counter and comparator 902, is received by the pseudooperation control state machine 904, a Reset and Trigger Counter signal will be issued by state machine 904 via line 906. The pseudooperation control state machine will output one of the signals Bank0 discharge, Bank1 discharge, Bank2 discharge or Bank3 discharge as it will be explained in conjunction with the state diagram illustrated in FIG. 10.

Figure 10:
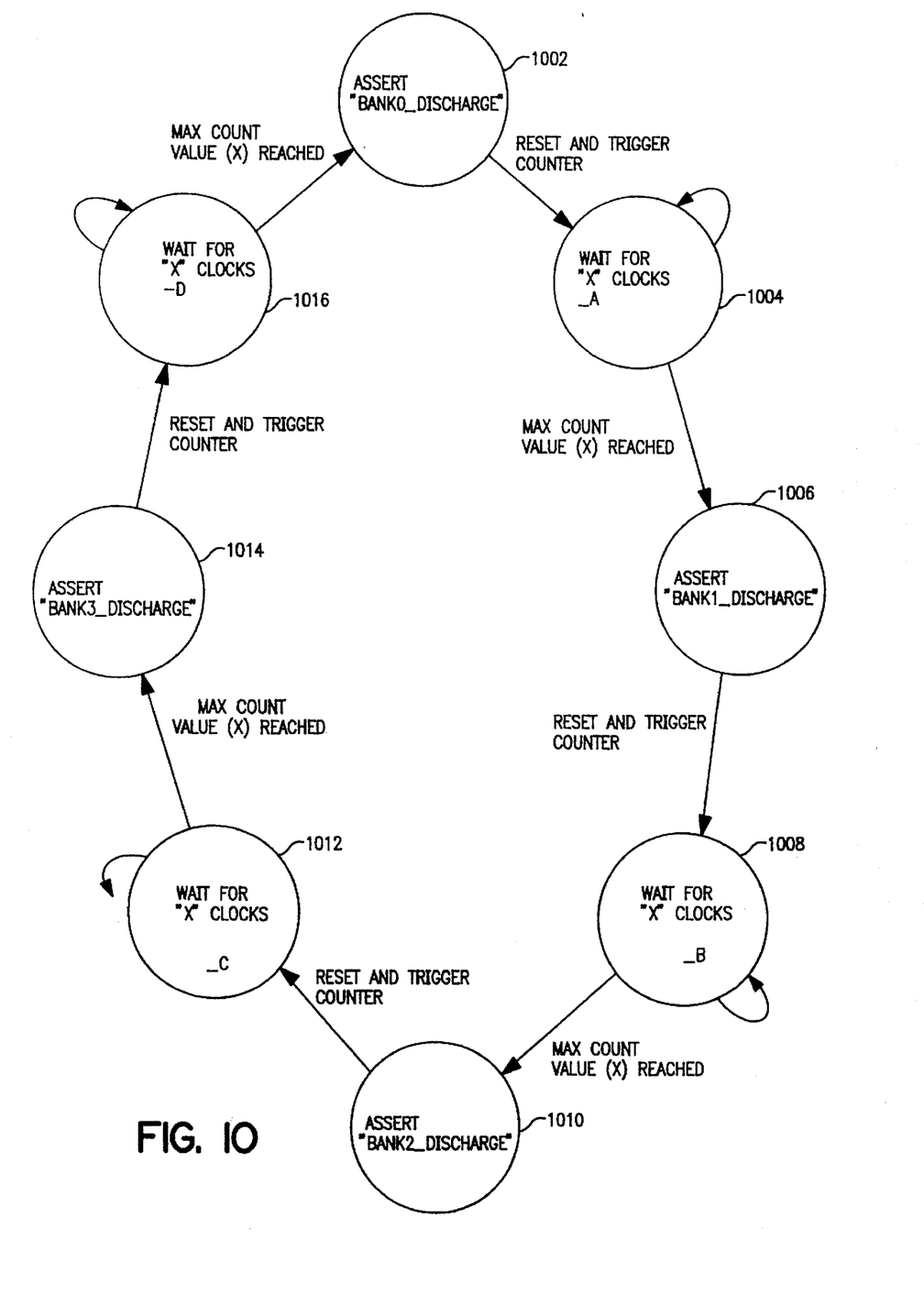
FIG. 10 illustrates a state machine diagram for the pseudooperation control circuit illustrated in FIG. 9.

FIG. 10 illustrates a state diagram of a "round-robin" state machine. The round-robin state machine is a free-running state machine which keeps cycling between its states as long as the clock is running. When the state machine is at state 1002, it asserts the signal "Bank0 discharge" which causes a pseudooperation or additional bit line discharge in Bank0. In the next clock, the state machine transitions to state 1004 where it resets the counter placed in the counter and comparator circuit 902. This counter typically counts from 0 up to a preprogrammed value X. The state machine remains in this state until the maximum count value X is reached. Once the maximum count value X is reached, the state machine moves to State 1006 and asserts Bank1 discharge signal, which causes a pseudo-operation bit-line discharge in Bank1. Then it moves on to the next state 1008 in FIG. 10. The same process applies to the other states shown in FIG. 10 and the state machine will complete the full cycle shown in FIG. 10 at state 1002 wherein it asserts Bank0 discharge signal. All cycles are then repeated again and again.

As one can see from the state diagram illustrated in FIG. 10, each bank will undergo an additional bit line discharge once every 4X+4 clocks. The X value has to be set so that it is small enough to prevent the bit line creep problem from manifesting. However, this value must be large enough so that additional bit line discharges are not triggered thereby causing unnecessary power dissipation. For example, if the bit line creep problem manifests itself after 100 consecutive clocks of bitline inactivity, X will have to be equals to 24 or even less, to ensure that each bit line is discharged once every 100 clocks.

Figure 11:
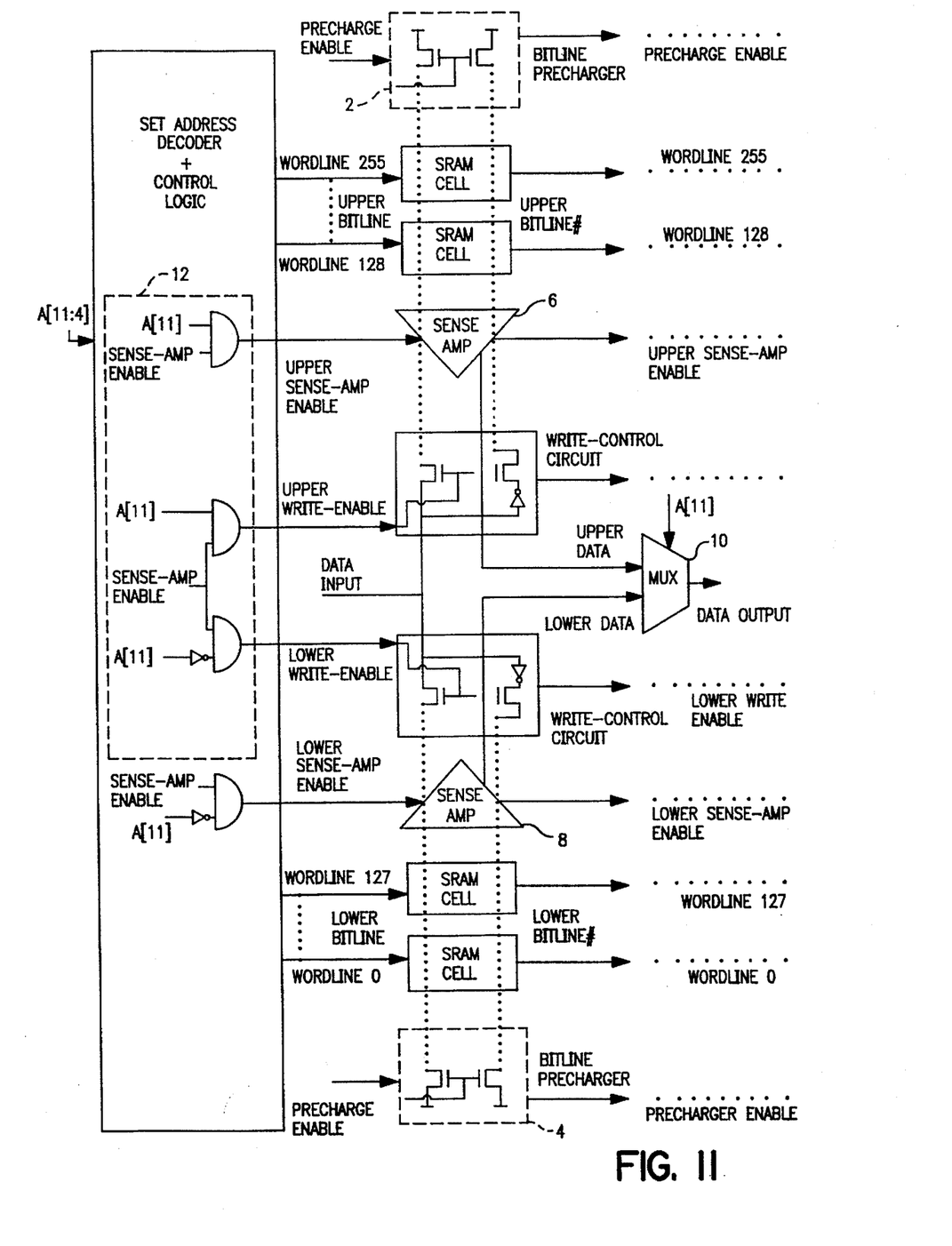
FIG. 11 shows an alternative embodiment of the data storage device according to the present invention.

FIG. 11 shows an alternative embodiment according to the present invention. The embodiment shown in FIG. 11 may be used in conjunction with the embodiment of FIG. 7 for counter-balancing the extra power dissipation caused by the performance of the additional bit line discharges which are required to prevent the bit line creep failure. In this embodiment, a memory array such as the array shown in FIG. 1a, is split in two parts. An upper part 2 and a lower part 4. Assuming that the memory array has 256 word lines, the memory array can be split in half, such that the upper part 2 includes word lines 128–255 and the lower part includes wordlines 0–127. Lower sense-amplifier 8 is coupled to the lower part while upper sense-amplifier 6 is coupled to the lower part. The outputs of the sense amplifiers 6 and 8 are coupled to two inputs of a 2×1 multiplexer 10. The multiplexer has been placed after the sense-amplifiers in order to avoid the signal degradation that is inherent in the bitlines. Such signal degradation in the bitlines going to the sense-amplifier would pose serious speed problems for high-speed SRAM devices. A cache-signal select circuit 12 (shown in dotted lines) is coupled to the lower and upper part of the memory array. This circuit selects the upper or the lower sense-amplifiers and the upper or lower part of the array by having the enable A[11] bit of the address vector A[11:4] controlling the write enable circuits and the sense-amplifiers of the lower and upper part. As one can see from FIG. 11 depending on whether A[11] is 1 or 0 the upper or lower part, respectively, will be operative, while the other part of the circuit will be disabled, saving thus power.

This embodiment also called split-cache architecture, is used to reduce power dissipation and to speed up the voltage transitions on bitline and bitline # when reading from the SRAM cells as the capacitances of bitline and bitline # are reduced by splitting the cache.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A data storage device for coupling to a data processing device, said data storage device comprising:
    a memory array partitioned into a plurality of memory banks;
    a bank enable circuit for enabling at least one of said plurality of memory banks;
    an operation/pseudooperation enable circuit (OPEC) for generating one of an operation signal and a pseudooperation signal to said at least one memory bank enabled by said bank enable circuit, said OPEC having a first input for receiving an operation request signal from said data processing device, and a second input; and
    a pseudooperation control circuit for controllably generating a pseudooperation request signal to said bank enable circuit and to said second input of said OPEC.

2. The data storage device of claim 1 wherein each of said memory banks includes one or more bitlines.

3. The data storage device of claim 2 wherein said operation request signal and said pseudooperation request signal generated by said data processing device and by said operation/pseudooperation circuit, respectively, are signals enabling a discharge of the bit lines, of one or more banks, from a first voltage potential to a second voltage potential.

4. The data storage device of claim 1 wherein said control circuit comprises, for each of said banks, a first counter, said counter being coupled to a clock generating clock cycles having a clock period.

5. The data storage device of claim 4 wherein said control circuit further comprises, for each of said banks, a comparator device, coupled to said counter device, for comparing a maximum count value with a current count value.

6. The data storage device of claim 1 wherein said pseudooperation control circuit includes a state machine circuit for generating said pseudooperation request signal.

7. The data storage device of claim 1 wherein said memory array is a cache device having a number W of wordlines and a number N of bitlines.

8. The data storage device of claim 1 wherein said operation/pseudooperation enable circuit has a first input, for receiving a wordline select signal, a second input for receiving a wordline pulse signal, a third input for receiving a bank enable signal, and an output for generating said operation or said pseudooperation signal.

9. The data storage device of claim 8 wherein said operation/pseudooperation enable circuit includes an AND gate.

10. The data storage device of claim 1 wherein said operation/pseudooperation enable circuit further includes a pulse timer having an input, for receiving a pulse trigger signal, and an output for generating said wordline pulse signal in response to said pulse trigger signal.

11. The data storage device of claim 10 wherein said operation/pseudooperation enable circuit includes a first OR gate having a first input for receiving a clock restart signal, a second input for receiving a cache cycle signal, and a third input for receiving said pseudooperation request signal, said first OR gate having an output for generating said pulse trigger signal.

12. The data storage device of claim 11 wherein said bank enable circuit comprises a second OR gate having a first input for receiving a bank select signal, a second input for receiving said pseudooperation request signal, and a third input for receiving said clock restart signal, said OR gate having an output for generating said bank enable signal.

13. In a computer system having a memory array, a data processing device, and a bus coupled to said data processing device, for coupling to said memory array, said computer system including:

a bank enable circuit, coupled to said bus, for enabling at least one of said plurality of memory banks;

an operation/pseudooperation enable circuit, coupled to said bus, for generating one of an operation signal and a pseudooperation signal to said at least one memory bank enabled by said bank enable circuit, said OPEC having a first input for receiving an operation request signal from said data processing device, and a second input; and a pseudooperation control circuit for controllably generating a pseudooperation request signal to said bank enable circuit and to said second input of said OPEC.

14. The computer system of claim 13 wherein each of said memory banks includes one or more bitlines.

15. The computer system of claim 14 wherein said operation request signal and said pseudooperation request signal generated by said data processing device and by said operation/pseudooperation circuit, respectively, are signals enabling a discharge of the bit lines, of one or more banks, from a first voltage potential to a second voltage potential.

16. The computer system of claim 13 wherein said control circuit comprises, for each of said banks, a first counter, said counter being coupled to a clock generating clock cycles having a clock period.

17. The computer system of claim 16 wherein said control circuit further comprises, for each of said banks, a comparator device, coupled to said counter device, for comparing a maximum count value with a current count value.

18. The computer system of claim 13 wherein said pseudooperation control includes a state machine circuit for generating said pseudooperation request signal.

19. The computer system of claim 13 wherein said memory array is a cache device having a number W of wordlines and a number N of bitlines.

20. A method for discharging the bitlines of a memory array, the method comprising the steps:

partitioning the memory array into a plurality of memory banks;

counting a number of clock cycles;

comparing said number clock cycles with a maximum count value; and generating a discharge request signal to at least one of said plurality of memory banks if said number of clock cycles is equal with the maximum count values; and discharging at least one of said memory banks for which a discharge request signal was generated.

* * * * *